(12) United States Patent
Gautham et al.

(10) Patent No.: US 7,160,798 B2
(45) Date of Patent: Jan. 9, 2007

(54) METHOD OF MAKING REINFORCED SEMICONDUCTOR PACKAGE

(75) Inventors: Viswanadam Gautham, Selangor (MY); Lan Chu Tan, Selangor (MY)

(73) Assignee: Freescale Semiconductor, Inc., Austin, TX (US)

(*) Notice: Subject to any disclaimer, the term of this patent is extended or adjusted under 35 U.S.C. 154(b) by 85 days.

(21) Appl. No.: 11/065,360

(22) Filed: Feb. 24, 2005

(65) Prior Publication Data

US 2006/0189120 A1  Aug. 24, 2006

(51) Int. Cl.
H01L 21/4763 (2006.01)

(52) U.S. Cl. .................. 438/618; 438/183

(58) Field of Classification Search ......... 438/183, 438/616, 618; 357/72, 74, 80, 81
See application file for complete search history.

(56) References Cited

U.S. PATENT DOCUMENTS

| | | | |
|---|---|---|---|
| 4,878,106 A * | 10/1989 | Sachs .................. | 257/796 |
| 5,144,412 A * | 9/1992 | Chang et al. ........... | 257/665 |
| 5,550,403 A * | 8/1996 | Carichner .............. | 257/702 |
| 5,872,051 A * | 2/1999 | Fallon et al. ........... | 438/616 |
| 6,180,504 B1 | 1/2001 | Farnworth et al. | |
| 6,272,744 B1 | 8/2001 | DiStefano et al. | |
| 6,329,224 B1 | 12/2001 | Nguyen et al. | |
| 6,413,798 B1 | 7/2002 | Asada | |
| 6,538,214 B1 | 3/2003 | Khandros | |
| 6,541,874 B1 | 4/2003 | Nguyen et al. | |
| 6,545,342 B1 | 4/2003 | Abbott | |
| 6,545,345 B1 | 4/2003 | Glenn et al. | |
| 6,617,681 B1 | 9/2003 | Bohr | |
| 6,634,100 B1 | 10/2003 | Akram et al. | |
| 6,657,313 B1 | 12/2003 | Brofman et al. | |
| 6,664,617 B1 | 12/2003 | Siu | |
| 6,710,456 B1 | 3/2004 | Jiang et al. | |
| 6,756,253 B1 | 6/2004 | Farnworth et al. | |
| 6,759,268 B1 | 7/2004 | Akagawa | |
| 6,762,488 B1 | 7/2004 | Maeda et al. | |
| 6,768,197 B1 | 7/2004 | Hosomi et al. | |
| 6,774,315 B1 | 8/2004 | Pierson et al. | |
| 6,777,789 B1 | 8/2004 | Glenn et al. | |
| 6,784,525 B1 | 8/2004 | Kuan et al. | |
| 2001/0012643 A1 | 8/2001 | Asada | |
| 2002/0063332 A1 | 5/2002 | Yamaguchi et al. | |
| 2002/0074636 A1 | 6/2002 | Siu | |
| 2003/0193039 A1 | 10/2003 | Brofman et al. | |
| 2003/0193091 A1 | 10/2003 | Yu et al. | |
| 2003/0194837 A1 | 10/2003 | Yu et al. | |

(Continued)

*Primary Examiner*—Phuc T. Dang
(74) *Attorney, Agent, or Firm*—Charles Bergere

(57) ABSTRACT

A method of making a reinforced semiconductor package includes forming a semiconductor interconnect tablet (24). Formation of the tablet includes providing a plurality of conductive metal tabs (10), positioning a first end (12) of the tabs (10) in a first section of a mold chase (14), positioning a second section of the mold chase (16) over a second end (18) of the tabs (10), such that the tabs (10) are anchored between the first and second sections (14, 16) of the mold chase, loading the first and second sections (14, 16) of the mold chase into a molding system (20) and performing a molding operation such that a plastic mold compound (22) is formed around the metal tabs (10) and an interconnect tablet (24) is formed. Then the first and second sections (14, 16) of the mold chase are removed from the molding system (20) and the interconnect tablet (24) is removed from the first and second sections (14, 16) of the mold chase.

16 Claims, 3 Drawing Sheets

U.S. PATENT DOCUMENTS

| | | |
|---|---|---|
| 2003/0207515 A1 | 11/2003 | Tan et al. |
| 2003/0224542 A1 | 12/2003 | Liu |
| 2004/0124545 A1 | 7/2004 | Wang |
| 2004/0130010 A1 | 7/2004 | Kuan et al. |
| 2004/0145039 A1 | 7/2004 | Shim et al. |
| 2004/0173891 A1 | 9/2004 | Imai et al. |

* cited by examiner

METHOD OF MAKING REINFORCED SEMICONDUCTOR PACKAGE

BACKGROUND OF THE INVENTION

The present invention relates to packaging of semiconductor devices in general and more specifically to a method of packaging a semiconductor device using a lead reinforced plastic tablet.

Small packages having high pin counts are in demand. There is pressure on the IC packing industry to provide ways to interconnect smaller circuits with more Inputs and Outputs (IOs). That is, very high density interconnects at die level must be translated to the much coarser pitch of printed circuit boards. Lead frames and interconnecting substrates are used to provide this IO pitch translation function. For example, a ball grid array (BGA) package uses an interposer substrate to convert the peripheral bonding sites of the die to an array configuration. Such interposers generally are made from ceramic materials having vias formed by drilling, punching, etching or laser that are metallized or filled with conductive metal. The processes for making interposers are difficult and expensive. Thus, a need exists for a method of making a high density package with fine pitch and high IO count interconnections at low cost.

Accordingly, it is an object of the present invention to provide a method of fabricating a low cost, high IO semiconductor package.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements.

DETAILED DESCRIPTION OF THE PREFERRED EMBODIMENTS

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

To achieve the objects and advantages discussed above and others, the present invention provides a method of forming a semiconductor interconnect tablet. The method includes the steps of providing a plurality of conductive metal tabs; positioning a first end of the tabs in a first section of a mold chase; and positioning a second section of the mold chase over a second end of the tabs, wherein the tabs are anchored between the first and second mold chases. The first and second sections of the mold chase are loaded into a molding system and a molding operation is performed, wherein a plastic mold compound is formed around the metal tabs, thereby forming an interconnect tablet. The first and second sections of the mold chase are removed from the molding system and the interconnect tablet is removed from the first and second mold sections of the mold chase.

The present invention also provides a method of forming a semiconductor device, which includes the steps outlined above for forming an interconnect tablet; performing a surface finishing operation on the interconnect tablet such that the first and second tab ends are generally coplanar with the plastic mold compound on top and bottom surfaces of the interconnect tablet; attaching an integrated circuit (IC) to the top surface of the interconnect tablet and electrically coupling the IC to the metal tabs of the interconnect tablet. Finally, the IC, electrical connections, and at least the top surface of the interconnect tablet are covered with an encapsulant.

FIGS. 1–8 illustrate a method of making an interconnect tablet in accordance with an embodiment of the present invention.

Figure 1:
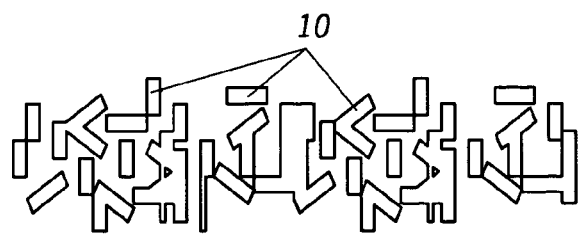
FIGS. 1–8 are enlarged cross-sectional views illustrating a method of making an interconnect tablet in accordance with the present invention.

Referring now to FIG. 1, a plurality of conductive metal tabs 10 are shown. The metal tabs 10 in this particular example are generally cylindrical in shape and have a length of about 1.0 to 2.0 millimeters (mm) and a diameter of about 0.2 mm to 1.2 mm. However, it should be understood that metal tabs of other shapes and dimensions may be employed as well, depending on the desired thickness of the interconnect tablet. The metal tabs 10 are formed of an electrically conductive material such as copper and may be plated with tin/gold.

Figure 2:
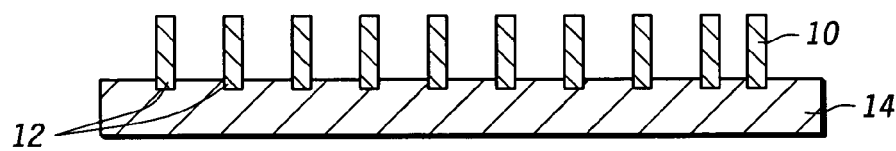

Referring now to FIG. 2, first ends 12 of the tabs 10 are positioned in a first section of a mold chase 14 as shown. The first ends 12 of the metal tabs 10 may be positioned in the first section of the mold chase 14 via a shaking operation. Such shaking operations are known in the art. In this particular example, about 0.5 mm of the first ends 12 of the metal tabs 10 extend into the first section of the mold chase 14. However, it should be understood that the present invention is not limited by the length of the metal tabs extending into the mold chase.

Figure 3:
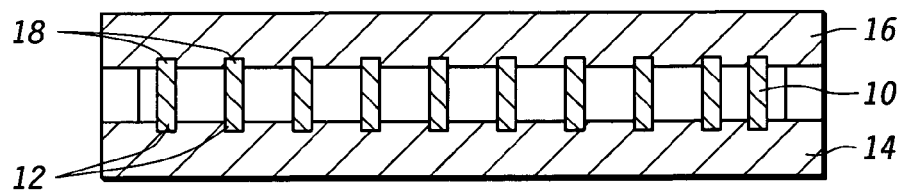

Referring now to FIG. 3, a second section of the mold chase 16 is positioned over a second end 18 of the tabs 10 such that the tabs 10 are anchored between the first and second sections 14 and 16 of the mold chase. The holes sizes are substantially the same as for the first section of the mold chase, where the metal tabs are smaller than the holes so that alignment between the two mold chases is easily carried out.

Figure 4:
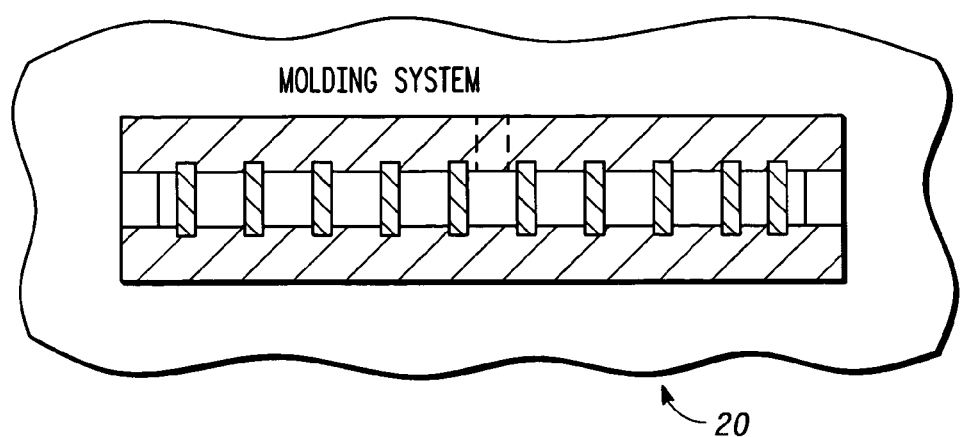
Figure 5:
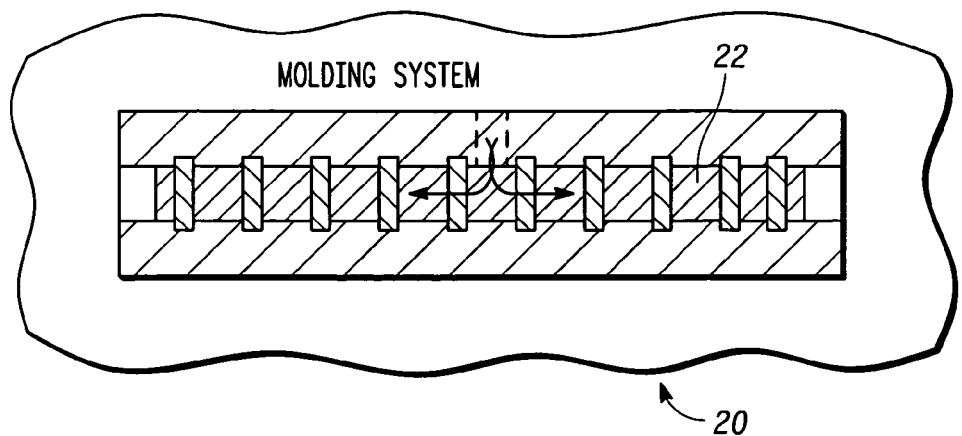
Figure 6:
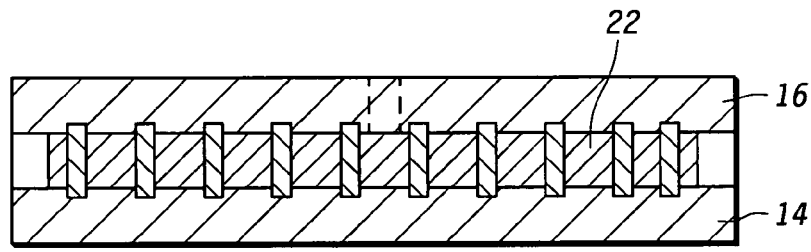

FIG. 4 shows the first and second sections 14 and 16 of the mold chase loaded into a molding system 20. FIG. 5 illustrates a molding operation. Specifically, a plastic mold compound 22 is formed around the metal tabs 10 so as to form an interconnect tablet 24. The metal tabs 10 serve as communication ports and also to reinforce the interconnect tablet 24. FIG. 6 shows the first 14 and second 16 sections of the mold chase removed from the molding system 20.

Figure 7:
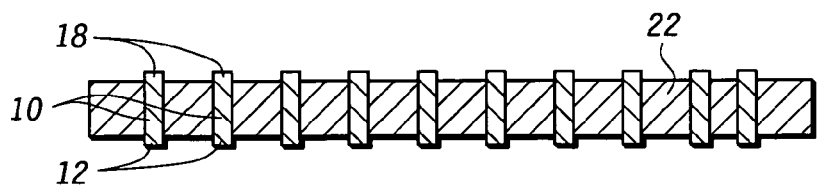
Figure 8:
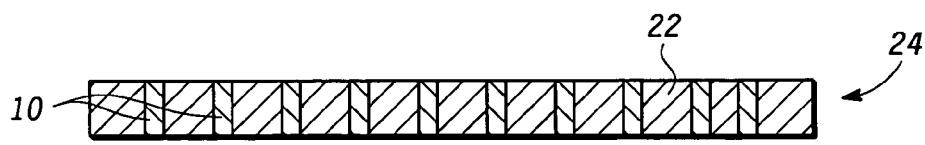

Referring now to FIG. 7, the interconnect tablet 24 next is removed from the first 14 and second 16 sections of the mold chase as shown. As can be seen, the first and second ends 12 and 18 of the metal tabs 10 extend beyond the plastic mold compound 22. FIG. 8 shows the interconnect tablet 24 after a surface finishing operation has been performed such that the first and second tab ends 12 and 18 are generally coplanar with the plastic mold compound 22 on top and bottom surfaces of the interconnect tablet 24. The surface finishing operation may include chemical wet etching, chemical dry etching, or surface grinding, as is known by those of skill in the art.

Figure 9:
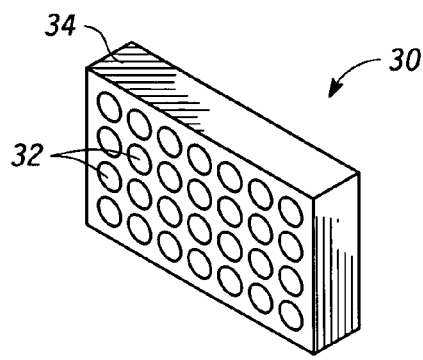
FIG. 9 is an enlarged perspective view of an interconnect tablet in accordance with an embodiment of the present invention.

FIG. 9 is a perspective view of an interconnect tablet 30 in accordance with an embodiment of the present invention. The interconnect tablet 30 comprises a plurality of conductive metal tabs 32 distributed within a plastic mold compound 34. In the embodiment shown, the tabs 32 are arranged in a 4×7 matrix. However, those of skill in the art will understand that the pattern as well as the number of metal tabs 32 may vary depending on the application of the tablet 34. The spacing between the tabs 32 may also vary depending on application. The metal tabs 32 serve as communication ports and also as reinforcement for the interconnect tablet 30. Although the metal tabs 32 in this particular example are illustrated as having a cylindrical shape, it should be understood that the present invention is not limited by the shape of the metal tabs.

The interconnect tablet 30 illustrated in FIG. 9 may be used to form a semiconductor device by attaching an integrated circuit (IC) to the top surface of the interconnect tablet 30, electrically coupling the IC to the metal tabs 32 of the interconnect tablet 30, and encapsulating the IC, electrical connections, and at least the top surface of the interconnect tablet 30 with an encapsulant.

Figure 10:
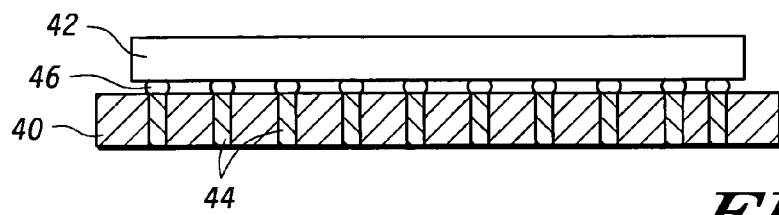
FIG. 10 is an enlarged cross-sectional view of an interconnect tablet and an IC attached thereto in accordance with an embodiment of the present invention.

FIG. 10 is a cross-sectional view of an interconnect tablet 40 and an integrated circuit (IC) 42 attached thereto in accordance with an embodiment of the present invention. In the embodiment shown, the IC 42 may comprise any type of IC, such as a controller, a DSP, etc. The IC 42 is attached to the interconnect tablet 40 as a flip-chip. Specifically, the IC 42 is attached to the tablet 40 and electrically coupled to respective ones of a plurality of metal tabs 44 with a plurality of conductive balls 46. Although not shown, the IC 42 and at least the top surface of the tablet 52 may be covered with a plastic encapsulant.

Figure 11:
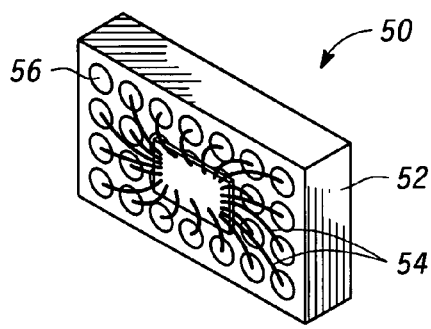
FIG. 11 is an enlarged perspective view of an IC attached to a surface of an interconnect tablet in accordance with another embodiment of the present invention.

FIG. 11 is a perspective view of an IC 50 attached to a surface of an interconnect tablet 52 in accordance with another embodiment of the present invention. The IC 50 may be attached to the interconnect tablet 52 with an adhesive. The IC 50 is electrically coupled to the interconnect tablet 52 by wire bonding a plurality of wires 54 between die bonding pads of the IC 50 and the metal tabs 56 of the interconnect tablet 52. The wires 54 may be coated or insulated wires or bare wires.

Figure 12A:
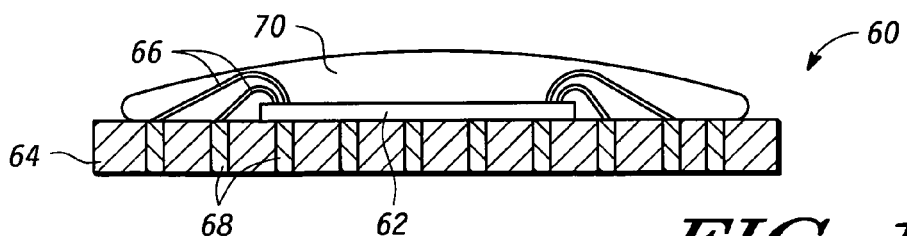
FIG. 12A is an enlarged cross-sectional view of a packaged semiconductor device in accordance with an embodiment of the present invention.

FIG. 12A is a cross-sectional view of a packaged semiconductor device 60 in accordance with an embodiment of the present invention. An IC 62 is electrically coupled to an interconnect tablet 64 by wire bonding a plurality of wires 66 between die bonding pads of the IC 62 and the metal tabs 68 of the interconnect tablet 64. A glob top encapsulating process is then performed to encapsulate the IC 62, electrical connections 66, and at least a top surface of the interconnect tablet 64 with an encapsulant 70.

Figure 12B:
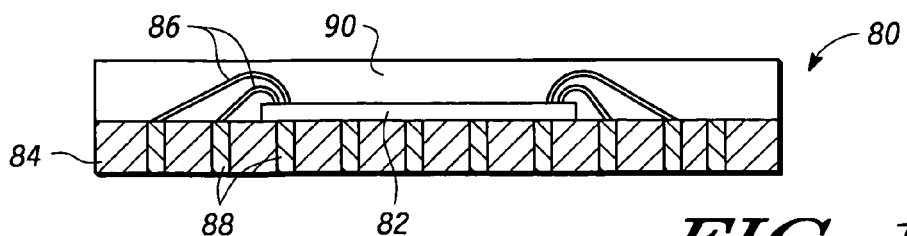
FIG. 12B is an enlarged cross-sectional view of a packaged semiconductor device in accordance with another embodiment of the present invention.

FIG. 12B is a cross-sectional view of a packaged semiconductor device 80 in accordance with another embodiment of the present invention. An IC 82 is electrically coupled to an interconnect tablet 84 by wire bonding a plurality of wires 86 between die bonding pads of the IC 82 and the metal tabs 88 of the interconnect tablet 84. A molding process is then performed to encapsulate the IC 82, electrical connections 86, and at least a top surface of the interconnect tablet 84 with an encapsulant 90.

As is evident from the foregoing discussion, the present invention provides a method of forming an interconnect tablet and a semiconductor device, which have benefits over existing processes. As an example, fine pitch packaging can be achieved with the present invention by employing finer metal tabs or reducing the spacing between metal tabs. In addition, the present invention provides a method of making a high density package with improved reliability at low cost by doing away with the need for intermediate substrates, thereby eliminating substrate processing costs and silicon to printed circuit board (PCB) thermal mismatch. Further, assembly and testing of semiconductor devices made in accordance with the present invention can be done in array (MAP) format, thereby achieving high throughput.

Thus it is apparent that there has been provided, in accordance with the invention, a method of forming a semiconductor device and a semiconductor device formed in accordance with such a method that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the metal tabs are not limited to copper, but may be any conductive material used in the art to form interconnections. As addressed earlier, the present invention is not limited by the shape of the metal tabs. Nor is the device configuration limited to flip chip and wire bond applications. It should be understood that the present invention may be implemented with multiple functional silicon die in stacked form by mixing flip chip and wire bond technologies on the same interconnect tablet. Furthermore, the present invention is not limited to those types of semiconductor die described or illustrated herein. Therefore, it is intended that this invention encompass all such variations and modifications as fall within the scope of the appended claims.

The invention claimed is:

1. A method of forming a semiconductor interconnect tablet, comprising:
    providing a plurality of conductive metal tabs;
    positioning a first end of the tabs in a first section of a mold chase;
    positioning a second section of the mold chase over a second end of the tabs, wherein the tabs are anchored between the first and second mold chases;
    loading the first and second mold chases into a molding system;
    performing a molding operation, wherein a plastic mold compound is formed around the metal tabs, thereby forming an interconnect tablet;
    removing the first and second mold chases from the molding system and removing the interconnect tablet from the first and second mold chases; and
    performing a surface finishing operation on the interconnect tablet such that the first and second tab ends are generally coplanar with the plastic mold compound on top and bottom surfaces of the interconnect tablet.

2. The method of forming a semiconductor interconnect tablet of claim 1, wherein the metal tabs have a length of about 1.0 to 2.0 mm.

3. The method of forming a semiconductor interconnect tablet of claim 1, wherein the metal tabs are comprised of copper.

4. The method of forming a semiconductor interconnect tablet of claim 3, wherein the metal tabs are plated with gold.

5. The method of forming a semiconductor interconnect tablet of claim 1, wherein the first ends of the metal tabs are positioned in the first section of the mold chase via a shaking operation.

6. A method of forming a semiconductor device, comprising the steps of:
providing a plurality of conductive metal tabs;
positioning a first end of the tabs in a first section of a mold chase;
positioning a second section of the mold chase over a second end of the tabs, wherein the tabs are anchored between the first and second mold chases;
loading the first and second mold chases into a molding system;
performing a molding operation, wherein a plastic mold compound is formed around the metal tabs, thereby forming an interconnect tablet;
removing the first and second mold chases from the molding system and removing the interconnect tablet from the first and second mold chases;
performing a surface finishing operation on the interconnect tablet such that the first and second tab ends are generally coplanar with the plastic mold compound on top arid bottom surfaces of the interconnect tablet;
attaching an integrated circuit to the top surface of the interconnect tablet; and
electrically coupling the integrated circuit to the metal tabs of the interconnect tablet, wherein the integrated circuit is attached to the tablet arid electrically coupled to the metal tabs with a plurality of conductive balls.

7. The method of forming a semiconductor device of claim 6, further comprising the step of:
encapsulating the integrated circuit, electrical connections, and at least the top surface of the interconnect tablet with an encapsulant.

8. The method of forming a semiconductor device of claim 7, wherein the encapsulating step comprises a molding process.

9. The method of forming a semiconductor device of claim 7, wherein the encapsulating step comprises a glob top encapsulating process.

10. The method of forming a semiconductor device of claim 6, wherein the integrated circuit is attached to the interconnect tablet with an adhesive.

11. The method of forming a semiconductor device of claim 6, wherein the integrated circuit is electrically coupled to the interconnect tablet by wire bonding a plurality of wires between die bonding pads of the integrated circuit and the metal tabs of the interconnect tablet.

12. A method of forming a semiconductor device, comprising the steps of:
providing a plurality of conductive metal tabs;
positioning a first end of the tabs in a first section of a mold chase;
positioning a second section of the mold chase over a second end of the tabs, wherein the tabs are anchored between the first and second mold chases;
loading the first and second mold chases into a molding system;
performing a molding operation, wherein a plastic mold compound is formed around the metal tabs, thereby forming an interconnect tablet;
removing the first and second mold chases from the molding system and removing the interconnect tablet from the first and second mold chases;
performing a surface finishing operation on the interconnect tablet such that the first and second tab ends are generally coplanar with the plastic mold compound on top and bottom surfaces of the interconnect tablet;
attaching an integrated circuit to the top surface of the interconnect tablet;
electrically coupling the integrated circuit to the metal tabs of the interconnect tablet, wherein the integrated circuit is attached to the tablet and electrically coupled to the metal tabs with a plurality of conductive balls; and
encapsulating the integrated circuit, electrical connections, and at least the top surface of the interconnect tablet with an encapsulant.

13. The method of forming a semiconductor device of claim 12, wherein the encapsulating step comprises a molding process.

14. The method of forming a semiconductor device of claim 12, wherein the encapsulating step comprises a glob top encapsulating process.

15. The method of forming a semiconductor device of claim 12, wherein the integrated circuit is attached to the interconnect tablet with an adhesive.

16. The method of forming a semiconductor device of claim 12, wherein the integrated circuit is electrically coupled to the interconnect tablet by wire bonding a plurality of wires between die bonding pads of the integrated circuit and the metal tabs of the interconnect tablet.

* * * * *

UNITED STATES PATENT AND TRADEMARK OFFICE
CERTIFICATE OF CORRECTION

| | | |
|---|---|---|
| PATENT NO. | : 7,160,798 B2 | Page 1 of 1 |
| APPLICATION NO. | : 11/065360 | |
| DATED | : February 24, 2005 | |
| INVENTOR(S) | : Viswanadam Gautham et al. | |

It is certified that error appears in the above-identified patent and that said Letters Patent is hereby corrected as shown below:

In Column 5, Line 31, Claim 6,

Change "arid" to --and--

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,160,798 B2 | Page 1 of 1 |
| APPLICATION NO. | : 11/065360 | |
| DATED | : January 9, 2007 | |
| INVENTOR(S) | : Viswanadam Gautham et al. | |

It is certified that error appears in the above-identified patent and that said Letters Patent is hereby corrected as shown below:

In Column 5, Line 31, Claim 6,

Change "arid" to --and--

This certificate supersedes Certificate of Correction issued August 7, 2007.

Signed and Sealed this

Twenty-eighth Day of August, 2007

JON W. DUDAS
*Director of the United States Patent and Trademark Office*